(12) United States Patent
Hirai et al.

(10) Patent No.: US 8,914,955 B2
(45) Date of Patent: Dec. 23, 2014

(54) METHOD FOR MANUFACTURING PIEZOELECTRIC ELEMENT AND METHOD FOR MANUFACTURING LIQUID EJECTION HEAD

(75) Inventors: Eiju Hirai, Okaya (JP); Hiroshi Ito, Suwa (JP); Toshihiro Shimizu, Fujimi-machi (JP); Jiro Kato, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 790 days.

(21) Appl. No.: 13/178,389

(22) Filed: Jul. 7, 2011

(65) Prior Publication Data

US 2012/0005871 A1   Jan. 12, 2012

(30) Foreign Application Priority Data

Jul. 8, 2010   (JP) ................. 2010-156000

(51) Int. Cl.
*H04R 17/00* (2006.01)
*H01L 41/332* (2013.01)
*B41J 2/14* (2006.01)
*B41J 2/16* (2006.01)
*H01L 41/29* (2013.01)

(52) U.S. Cl.
CPC ........... *H01L 41/332* (2013.01); *B41J 2/14233* (2013.01); *B41J 2/161* (2013.01); *B41J 2/1628* (2013.01); *B41J 2/1629* (2013.01); *B41J 2/1642* (2013.01); *B41J 2/1645* (2013.01); *B41J 2/1646* (2013.01); *H01L 41/29* (2013.01)
USPC ............. 29/25.35; 29/594; 29/609.1; 216/62; 216/65; 216/66; 310/324; 310/328; 310/330; 310/331; 310/335

(58) Field of Classification Search
CPC ......... H01L 41/09; H01L 41/18; H01L 41/22; H01L 41/25; H01L 41/27; H01L 41/29; H01L 41/35; B41J 2/045; B41J 2/55; B41J 2/1621; B41J 2/1623; B41J 2/1628; B41J 2/1629; B41J 2/1635; B41J 2/1643; B41J 2/1646; B41J 2/1607; B41J 2/1612; B41J 2/162; B41J 2/14277
USPC ......... 29/5.35, 592.1, 594, 602.1, 609, 609.1; 310/324, 328, 330, 331, 335, 348; 216/62, 65, 66
See application file for complete search history.

(56) References Cited

U.S. PATENT DOCUMENTS 8,262,203 B2 * 9/2012 Hirai et al. .................. 347/71
8,360,558 B2 * 1/2013 Hirai et al. .................. 347/70
(Continued)

FOREIGN PATENT DOCUMENTS

JP   2005-088441   4/2005

*Primary Examiner* — Paul D Kim
(74) *Attorney, Agent, or Firm* — Workman Nydegger

(57) ABSTRACT

A method for manufacturing a piezoelectric element includes a process for forming a first conductive layer, a process for forming a piezoelectric layer having a region serving as an active region, a process for forming a second conductive layer, which overlaps with the region, a process for forming a third conductive layer, which overlaps with the region, on the second conductive layer, a process for forming an opening portion that divides the third conductive layer into a first portion and a second portion, a process for forming a resist layer that covers the opening portion and a peripheral portion at the side of the opening portion of the first portion and the second portion; a process for etching the third conductive layer to form a first conductive portion and a second conductive portion, and a process for etching the second conductive layer to form a third conductive portion.

10 Claims, 6 Drawing Sheets

(56) References Cited

U.S. PATENT DOCUMENTS

| | | | |
|---|---|---|---|
| 8,459,783 B2 * | 6/2013 | Hirai et al. | 347/71 |
| 8,506,057 B2 * | 8/2013 | Hirai | 347/68 |
| 2009/0284568 A1 * | 11/2009 | Yazaki | 347/68 |

* cited by examiner

METHOD FOR MANUFACTURING PIEZOELECTRIC ELEMENT AND METHOD FOR MANUFACTURING LIQUID EJECTION HEAD This application claims a priority to Japanese Patent Application No. 2010-156000 filed on Jul. 8, 2010 which is hereby expressly incorporated by reference herein in its entirety.

BACKGROUND

1. Technical Field

The present invention relates to a method for manufacturing a piezoelectric element and a method for manufacturing a liquid ejection head.

2. Related Art

For example, a liquid ejection head having a piezoelectric element is known as a liquid ejection head, such as an ink jet printer for ejecting liquid droplets, such as ink. Such a liquid ejection head can change the pressure in a pressure chamber formed under the piezoelectric element by displacing the piezoelectric element by a driving signal or the like, for example, and can eject liquid droplets, such as ink, supplied into the pressure chamber from a nozzle opening.

In such a liquid ejection head, there is one having a structure in which a piezoelectric layer is covered with an upper electrode for the purpose of protecting the piezoelectric layer of a piezoelectric element vulnerable to external factors, such as humidity (JP-A-2005-88441). Such a piezoelectric element has an active region in which the piezoelectric layer is sandwiched between a lower electrode and an upper electrode and generally the active region has a shape of extending in a specific direction in plan view. In such a piezoelectric element, the displacement amount of the piezoelectric element becomes excessively large in the end portion in the longitudinal direction of the active region. As a result, cracks are generated in the piezoelectric layer of the piezoelectric element to reduce the reliability in some cases.

Therefore, a method for manufacturing a piezoelectric element that can highly accurately and simply manufacturing a piezoelectric element having high reliability capable of suppressing the generation of cracks has been desired.

SUMMARY

An advantage of some aspects of the invention is to provide a method for manufacturing a piezoelectric element that can highly accurately and simply manufacturing a piezoelectric element having high reliability and a liquid ejection head.

(1) A method for manufacturing a piezoelectric element which is one of the embodiments of the invention includes: a process for forming a first conductive layer on a substrate, a process for forming a piezoelectric layer having a region serving as an active region on the first conductive layer, a process for forming a second conductive layer, which overlaps with the region, on the piezoelectric layer, a process for forming a third conductive layer, which overlaps with the region, on the second conductive layer, a process for forming an opening portion that divides the third conductive layer into a first portion and second portion in the third conductive layer above the region, a process for forming a resist layer that covers the opening portion and a peripheral portion at the side of the opening portion of the first portion and the second portion, a process for etching the third conductive layer using the resist layer to form a first conductive portion and a second conductive portion, and a process for etching the second conductive layer using the resist layer to form a third conductive portion.

In the invention, the wording "on" is used for, for example, describing that "another specific thing (hereinafter referred to as "B") is formed "on" a specific thing (hereinafter referred to as "A")". In the invention, the wording "on" is used when the case of such an example includes the case where B is directly formed on A and the case where B is formed on A through another thing. Similarly, the wording "under" includes the case where B is formed directly under A and the case where B is formed under A through another thing.

According to the invention, since the first and second conductive portions and the third conductive portion are formed using the same resist layer, the first and second conductive portions can be disposed with high accuracy at the end portion of the third conductive portion. According to the above, it is not necessary to consider the alignment error of the arrangement of the first and second conductive portions at the end portion of the third conductive portion in the manufacturing process, and thus a highly reliable piezoelectric element can be simply and highly accurately manufactured.

(2) In the method for manufacturing a piezoelectric element which is one of the embodiments of the invention, the etching of the process for forming the first conductive portion and the second conductive portion may be wet etching and the etching of the process for forming the third conductive portion may be dry etching.

(3) In the method for manufacturing a piezoelectric element which is one of the embodiments of the invention, the materials of the second conductive layer may be different from the materials of the third conductive layer.

(4) In the method for manufacturing a piezoelectric element which is one of the embodiments of the invention, the materials of the second conductive layer may include iridium and the materials of the third conductive layer may include gold and nickel-chromium alloy.

(5) In the method for manufacturing a piezoelectric element which is one of the embodiments of the invention, the process for forming the piezoelectric layer may include a process for forming a contact hole that exposes a portion of the first conductive layer at the position apart from the second conductive layer, the process for forming the second conductive layer and the third conductive layer may include a process for forming a lead wiring layer that is electrically connected to the first conductive layer in the contact hole and is apart from the second conductive layer and the third conductive layer, and the process for forming the third conductive portion may include a process for forming a concave portion at a portion where the piezoelectric layer between the second conductive layer and the lead wiring layer that are apart from each other is exposed.

(6) A method for manufacturing a liquid ejection head which is one of the embodiments of the invention includes the method for manufacturing a piezoelectric element according to any one of the above-described items.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferable embodiments of the invention will be described in detail using the drawings. First, a piezoelectric element 100 manufactured by a method for manufacturing a piezoelectric element according to this embodiment will be described, an example of a liquid ejection head 600 containing the piezoelectric element 100 will be described, and then a method for manufacturing a piezoelectric element according to this embodiment will be described. The embodiments described below do not unfairly limit the contents of the invention described in Claims. Moreover, all of the structures described below are not necessarily indispensable constituent elements of the invention.

1. Piezoelectric Element

Figure 1A:
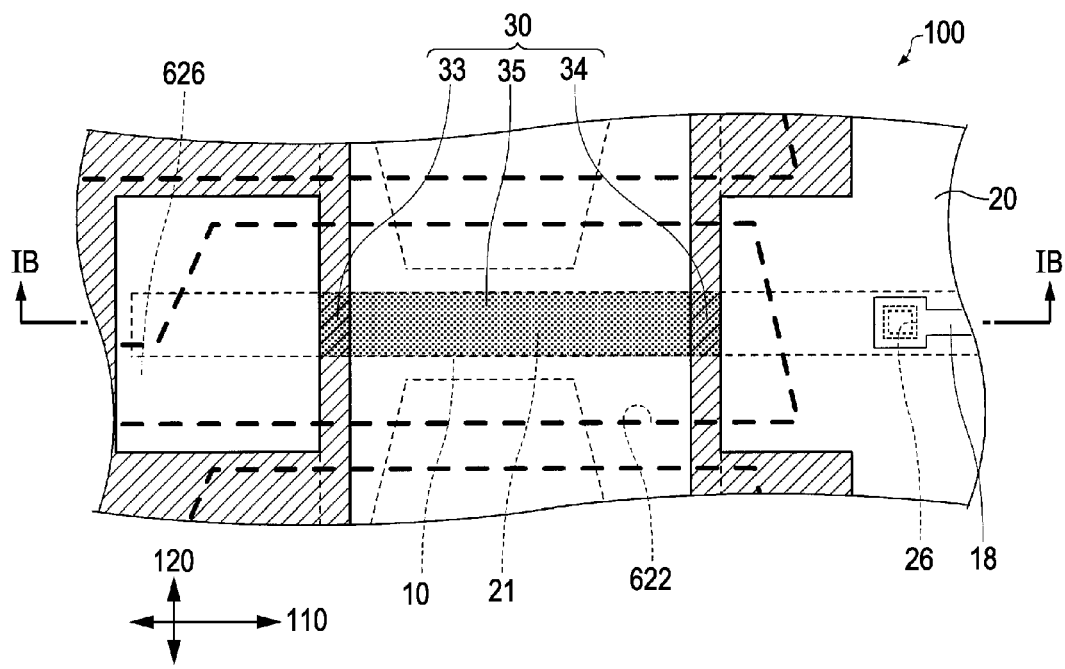
FIG. 1A is a plan view schematically illustrating a piezoelectric element manufactured by a method for manufacturing a piezoelectric element of this embodiment and FIG. 1B is a cross sectional view of the piezoelectric element in the IB-IB line illustrated in FIG. 1A.
Figure 1B:
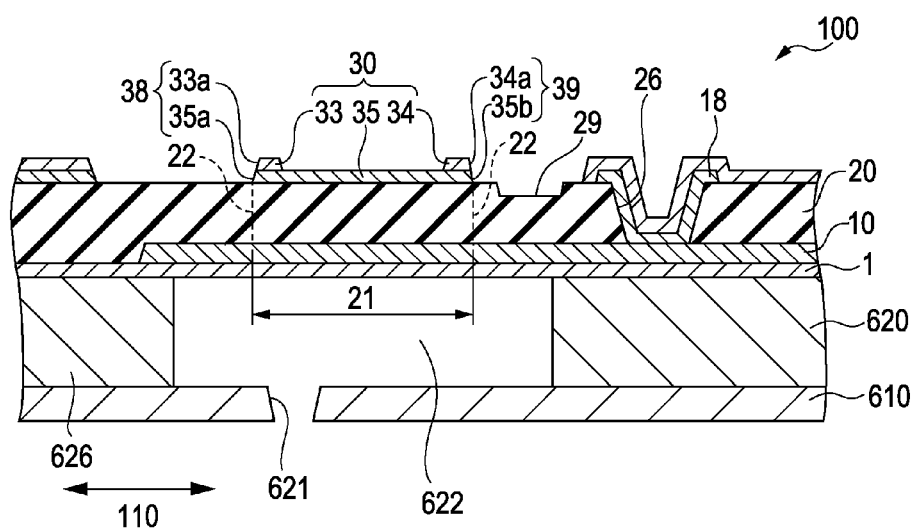

FIG. 1A is a plan view schematically illustrating a principal portion of a piezoelectric element 100 manufactured by the method for manufacturing a piezoelectric element of this embodiment and a liquid ejection head 600 (refer to FIG. 2) containing the piezoelectric element 100 and FIG. 1B is a cross sectional view along the 1B-1B line illustrated in FIG. 1A.

A substrate 1 can be a plate formed with a conductive material, a semiconductor, and an insulator, for example. The substrate 1 may be a single layer structure or a structure in which two or more layers are laminated. The internal structure of the substrate 1 is not limited insofar as the upper surface has a two-dimensional shape and may have a structure in which a space or the like is formed thereinside, for example.

When the piezoelectric element 100 is contained in the liquid ejection head 600, the substrate 1 is a diaphragm and serves as a member that mechanically outputs when the piezoelectric element 100 operates. The substrate 1 can serve as a movable portion of a piezoelectric actuator containing the piezoelectric element 100 and may constitute a portion of the wall of a pressure chamber or the like. The thickness of the substrate 1 is optimally selected according to the size of a pressure chamber described later, the drive frequency, the elastic modulus of materials to be used, or the like. The thickness of the substrate 1 may be 200 nm or more and 2000 nm or lower, for example. When the thickness of the substrate 1 is smaller than 200 nm, it sometimes become difficult to take out mechanical output, such as vibration. When the thickness of the substrate 1 is larger than 2000 nm, vibration or the like sometimes does not occur. The substrate 1 can bend or vibrate due to the operation of a piezoelectric layer 20.

When the substrate 1 is a diaphragm, the materials of the substrate 1 desirably contain materials having high rigidity and high mechanical strength. As the materials of the substrate 1, inorganic oxides, such as zirconium oxide, silicon nitride, and silicon oxide and alloys, such as stainless steel, can be used, for example. Among the above, the materials of the substrate 1 are preferably silicon oxide and zirconium oxide in terms of chemical stability and rigidity. The substrate 1 may be a laminate structure of two or more kinds of the substances mentioned above.

The piezoelectric element 100 is provided above the substrate 1 as illustrated in FIG. 1A and FIG. 1B. As illustrated in FIG. 1A and FIG. 1B, the piezoelectric element 100 contains a first electrode 10 provided on the substrate 1, a piezoelectric layer 20 formed in such a manner as to cover the first electrode 10, and a second electrode 30 formed in such a manner as to cover at least one portion of the piezoelectric layer 20.

As illustrated in FIG. 1B, the piezoelectric layer 20 has an active region 21 sandwiched between the first electrode 10 and the second electrode 30 above a pressure chamber 622. Here, the active region 21 is a region, of the piezoelectric layer 20, that substantially drives by the application of a voltage by the first and second electrodes 10 and 30, and is a region sandwiched between the first and second electrodes 10 and 30, after manufacturing or a region that is division of the piezoelectric layer 20 in design in the manufacturing process. In FIG. 1A, the active region 21 is a region indicated in gray.

As illustrated in FIG. 1A, the first electrode 10 (which is referred to as "the first conductive layer 10" in the method for manufacturing a piezoelectric element of this embodiment described later) is formed in such a manner as to extend in a specific direction on the substrate 1 (diaphragm). Here, the direction (longitudinal direction in plan view of the first electrode 10) in which the first electrode 10 extends is defined as a first direction 110. The direction crossing the first direction 110 is defined as a second direction 120. The second direction 120 may be a short-side direction in plan view of the first electrode 10 or a direction in which the piezoelectric elements 100 are disposed in parallel when two or more of the piezoelectric elements 100 are formed, for example.

Here, in the invention, the wording "in plan view" is used as a wording that means "plan view as viewed from the normal line direction of a surface of the substrate 1 on which the piezoelectric element 100 is formed".

The shape of the first electrode 10 is not particularly limited insofar as the first electrode 10 overlaps with the second electrode 30 described later and the active region 21 can be formed above the pressure chamber 622. For example, the first electrode 10 may have ends in the first direction 110 on the outer side of the second electrode 30 described later in plan view as illustrated in FIGS. 1A and 1B.

The structures and materials of the first electrode 10 are not particularly limited insofar as the first electrode 10 has conductivity. Usable for the materials of the first electrode 10 are, for example, various kinds of metal, such as Ni, Ir, Au, Pt, W, Ti Pd, Ag, Ta, Mo, and Cr, and alloys of the metals, conductive oxides thereof (e.g., iridium oxide), complex oxides of Sr and Ru, complex oxides of La and Ni, and the like. The first electrode 10 may be a single layer of the materials mentioned above or may have a structure in which two or more materials are laminated. The thickness of the first electrode 10 is not particularly limited and can be set to 20 nm or more and 400 nm or lower, for example.

Although not illustrated, the first electrode 10 may contain a barrier layer containing Ti, Ti—W alloy, or the like. The barrier layer may be provided at the boundary surface of the first electrode 10 and the substrate 1 (diaphragm) and may be provided at the boundary surface of the first electrode 10 and the piezoelectric layer 20.

Although not illustrated, the first electrode 10 may contain a layer, an adhesion layer for increasing the adhesion strength between the substrate 1, diaphragm, and the first electrode 10. The adhesion layer may be formed with titanium, titania (TiO2), zirconia, zirconium, or the like.

The piezoelectric layer 20 is provided above the substrate 1 (diaphragm) and the first electrode 10 as illustrated in FIG. 1A and FIG. 1B. The shape of the piezoelectric layer 20 is not particularly limited insofar as the piezoelectric layer 20 is formed in such a manner as to cover the first electrode 10 above the pressure chamber 622. For example, when the two or more piezoelectric elements 100 are formed along the second direction 120, opening portions may be formed in each space between the two or more adjacent active regions 21 in the piezoelectric layer 20.

The piezoelectric layer 20 contains a polycrystalline material having piezoelectric characteristics and can vibrate by the application of a voltage in the piezoelectric element 100. The structure of the piezoelectric layer 20 may have piezoelectric characteristics and is not particularly limited. As the materials of the piezoelectric layer 20, a perovskite oxide represented by Formula ABO3 is preferably used. Mentioned as specific examples of such materials are lead zirconate titanate (Pb(Zr, Ti)O3), lead zirconate titanate niobate (Pb(Zr, Ti, Nb)O3), barium titanate (BaTiO3), potassium sodium niobate (K, Na) (NbO3), and the like. The thickness of the piezoelectric layer 20 is not particularly limited and can be set to 300 nm or more and 5000 nm or lower, for example.

As illustrated in FIG. 1A and FIG. 1B, the contact hole 26 that expose one portion of the first electrode 10 is formed in the piezoelectric layer 20. The position of the contact hole 26 may be on the first electrode 10 in which the pressure chamber 622 is not provided below and is apart from a region in which the second electrode 30 described later is provided and is not particularly limited. For example, as illustrated in FIG. 1B, the contact hole 26 is disposed in such a manner as to be adjacent to the active region 21 in the first direction 110. The shape of the contact hole 26 may expose the first electrode 10 and is not particularly limited.

As illustrated in FIG. 1A and FIG. 1B, a lead wiring layer 18 is formed in the contact hole 26. The lead wiring layer 18 is an extraction wiring of the first electrode 10 and is connected to a drive circuit which is not illustrated. Therefore, the lead wiring layer 18 is electrically insulated from the second electrode 30 described later. Usable for the lead wiring layer 18 are various kinds of metal, such as Ni, Ir, Au, Pt, W, Ti, Ta, Mo, and Cr, and alloys of the metals, conductive oxides thereof (e.g., iridium oxide), a complex oxide of Sr and Ru, a complex oxide of La and Ni, and the like, for example. As illustrated in FIG. 1B, the lead wiring layer 18 may constituted by a laminate of two or more conductive layers or may be constituted by a single layer.

Moreover, as illustrated in FIG. 1B, a concave portion 29 may be formed in the piezoelectric layer 20 between the lead wiring layer 18 and the second electrode 30 described later. The shape of the concave portion 29 is not particularly limited insofar as the concave portion 29 is depressed relative to the surface of the piezoelectric layer 20 on which the second electrode 30 is formed and may extend in the second direction 120 although not illustrated. The concave portion 29 may be a concave portion formed by overetching of the piezoelectric layer 20 in an etching process of the method for manufacturing a piezoelectric element according to this embodiment. The concave portion 29 may be a rough surface (surface subjected to surface roughing processing) formed so that two or more concave and convex portions are adjacent to each other (not illustrated). Thus, the surface distance containing the piezoelectric layer 20 between the second electrode 30 and the lead wiring layer 18 that are electrically insulated from each other mutually can be further increased. Therefore, the insulation properties of the second electrode 30 and the lead wiring layer 18 can be increased, so that a short circuit between the second electrode 30 and the lead wiring layers 18 can be avoided.

As illustrated in FIG. 1A and FIG. 1B, the second electrode 30 is provided on the piezoelectric layer 20, overlaps with the first electrode 10 above the pressure chamber 622, and forms the active region 21 in the piezoelectric layer 20. The shape of the second electrode 30 is not limited insofar as the active region 21 can be formed in the piezoelectric layer 20 above the pressure chamber 622. For example, as illustrated in FIGS. 1A and 1B, the second electrode 30 has both end portions 38 and 39 in the first direction 110 above the pressure chamber 622 of a flow path formation plate 620. As illustrated in FIG. 1A and FIG. 1B, the end portion at the side, on which the lead wiring layer 18 is formed, in the first direction 110 of the second electrode 30 may be the end portion 39 and the opposite side may be the end portion 38. When two or more of the piezoelectric elements 100 are formed in the second direction 120, the second electrodes 30 are electrically connected to each other and function as a common electrode. Although not illustrated, the second electrode 30 may be electrically connected to a drive circuit which is not illustrated.

As illustrated in FIG. 1A and FIG. 1B, the second electrode 30 contains a first conductive portion 33, a second conductive portion 34, and a third conductive portion 35. As illustrated in FIG. 1B, the first conductive portion 33 and the second conductive portion 34 are disposed, respectively, on both the end portions 38 and 39 of the third conductive portion 35.

The third conductive portion 35 is a conductive portion provided on the piezoelectric layer 20 above the active region 21 as illustrated in FIG. 1A and FIG. 1B. Both the end portions 35a and 35b in the first direction 110 of the third conductive portion 35 constitute a part of both the end portions 38 and 39 of the second electrode 30, respectively as illustrated in FIG. 1A and FIG. 1B. The materials of the third conductive portion 35 are not particularly limited insofar as the materials are substances having conductivity. Usable as the materials of the third conductive portion 35 are, for example, various kinds of metal, such as Ir, Ni, Au, Pt, W, Ti, Ta, Mo, Cr, Pd, and Ag, and alloys of the metals, conductive oxides thereof (e.g., iridium oxide), a complex oxide of Sr and Ru, a complex oxide of La and Ni, and the like. The third conductive portion 35 may be a single layer of the materials mentioned above or have a structure in which two or more materials are laminated. The thickness of the third conductive portion 35 is not particularly limited and can be set to 10 nm or more and 200 nm or lower, for example.

In FIG. 1A, the first conductive portion 33 is a diagonally shaded portion. The first conductive portion 33 is disposed on one end portion 35a in the first direction 110 of the third conductive portion 35 as illustrated in FIG. 1A and FIG. 1B. As illustrated in FIG. 1B, the end portion 33a of the first conductive portion 33 constitutes a portion of the end portion 38 of the second electrode 30. Here, the end portion 33a is disposed near the side surface of the end portion 35a as much as possible while not covering the side surface of the end portion 35a of the third conductive portion 35. When the length of the first direction 110 of the active region 21 in plan view is defined as L, the width in the first direction 110 of the first conductive portion 33 may be shorter than L/2, which is the half length, and can be designed as appropriate. The thickness of the first conductive portion 33 is not particularly limited and can be set to 50 nm or more and 5000 nm or lower, for example.

As illustrated in FIG. 1A, the first conductive portion 33 may be disposed in such a manner as not to overlap with the first electrode 10 in the region outside the active region 21 in plan view. When two or more of the piezoelectric elements 100 are formed, the first conductive portion 33 may be a common conductive portion in the second direction 120. The materials of the first conductive portion 33 are not limited insofar as the materials have conductivity and materials having higher conductivity than that of the third conductive portion 35 are preferably used. For example, the first conductive portion 33 contains Au. Moreover, the first conductive portion 33 may further contain copper (Cu), Ni, Ni—Cr alloy, palladium (Pb), or the like.

In FIG. 1A, the second conductive portion 34 is a diagonally shaded portion similarly as the first conductive portion 33. The second conductive portion 34 is disposed on one end portion 35b in the first direction 110 of the third conductive portion 35 as illustrated in FIG. 1A and FIG. 1B. As illustrated in FIG. 1B, the end portion 34a of the second conductive portion 34 constitutes a portion of the end portion 39 of the second electrode 30. Here, the end portion 34a is disposed near the side surface of the end portion 35b as much as possible while not covering the side surface of the end portion 35b of the third conductive portion 35. The structure (length, thickness) and the materials of the second conductive portion 34 may be the same as those of the first conductive portion 33.

As illustrated in FIG. 1A, the second conductive portion 34 may be disposed in such a manner as to be sufficiently from the lead wiring layer 18 of the first electrode 10, so that the second conductive portion 34 and the first electrode 10 are insulated from each other in the region outside the active region 21 in plan view. When two or more of the piezoelectric elements 100 are formed, the second conductive portion 34 may be a common conductive portion in the second direction 120.

According to any one of the structures described above, the structure of the piezoelectric element 100 can be achieved. In such a piezoelectric element 100, the first conductive portion 33 and the second conductive portion 34 are disposed on both the end portions 38 and 39 in the first direction 110 that is a longitudinal direction of the piezoelectric element 100 as described above. According to the structure, the first conductive portion 33 and the second conductive portion 34 can suppress excessive displacement and vibration generally arising in the end portions in the longitudinal direction of the active region 21. Therefore, cracks generated in the end portions of the longitudinal direction of the active region 21 can be suppressed, and thus the reliability of the piezoelectric element 100 increases.

Here, by disposing the first and second conductive portions 33 and 34 with high accuracy in such a manner as to be closer to the end portions 35a and 35b of the third conductive portion 35, an effect of suppressing excessive displacement and vibration in the end portions in the longitudinal direction of the active region 21 can be further increased. More specifically, by disposing the end portions 33a and 34a in such a manner as to be close to the side surface of both the end portions 35a and 35b of the third conductive portion 35 as much as possible in plan view as illustrated in FIG. 1B, the reliability of the piezoelectric element 100 can be further increased.

2. Liquid Ejection Head

Figure 2:
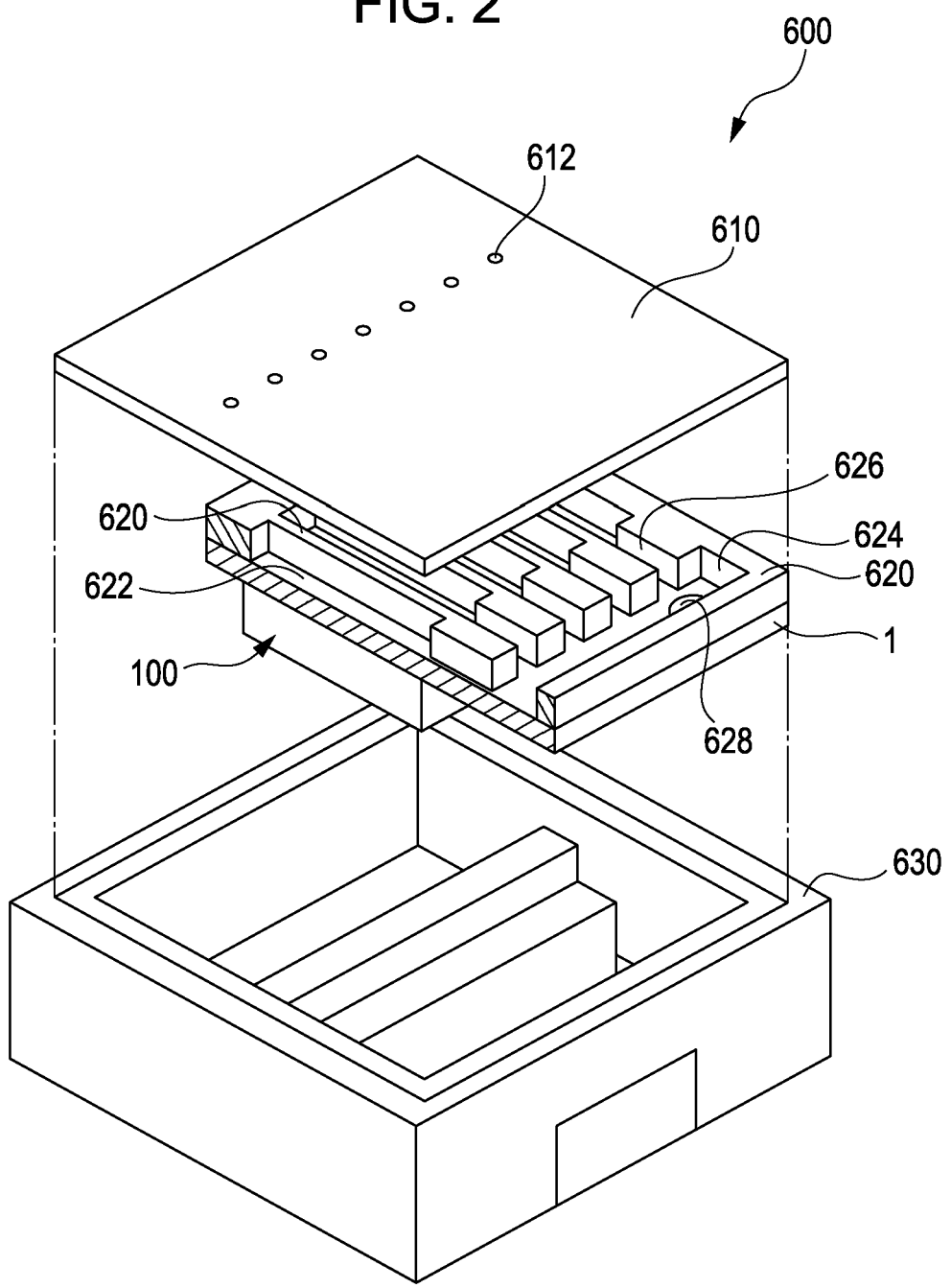
FIG. 2 is an exploded perspective view schematically illustrating a liquid ejection head containing the piezoelectric element manufactured by the method for manufacturing the piezoelectric element of this embodiment.

Next, the liquid ejection head 600 in which the piezoelectric element 100 according to this embodiment functions as an piezoelectric actuator will be described with reference to drawings. FIG. 1A and FIG. 1B are a plan view and a cross sectional view, respectively, schematically illustrating the principal portion (piezoelectric element 100) of the liquid ejection head 600 according to this embodiment. FIG. 2 is an exploded perspective view of the liquid ejection head 600 according to this embodiment, in which the liquid ejection head 600 appears upside down from its usual state.

The liquid ejection head 600 has the above-described piezoelectric element 100. The following examples describes the piezoelectric element 100 in which the substrate 1 is formed as a diaphragm and the liquid ejection head 600 is constituted as a piezoelectric actuator.

The liquid ejection head 600 contains a nozzle plate 610 having nozzle openings 621, a flow path formation plate 620 for forming the pressure chamber 622, and the piezoelectric element 100 as illustrated in FIG. 1A, FIG. 1B, and FIG. 2.

The number of the piezoelectric elements 100 is not particularly and two or more of the piezoelectric elements 100 may be formed. When two or more of the piezoelectric elements 100 are formed, the second electrode 30 serves as a common electrode. Furthermore, the liquid ejection head 600 can have a case 630 as illustrated in FIG. 2. In FIG. 2, the piezoelectric element 100 is illustrated in a simplified manner.

The nozzle plate 610 has nozzle openings 621 as illustrated in FIG. 1A, FIG. 1B, and FIG. 2. From the nozzle openings 621, liquid, such as ink, (including not only liquid but various kinds of functional materials that are adjusted to a suitable viscosity by a solvent or a dispersion medium or one containing metal flakes or the like, the same applied in the following description) can be ejected as liquid droplets. In the nozzle plate 610, a large number of the nozzle openings 621 are provided in one row, for example. As the materials of the nozzle plate 620, silicon, stainless steel (SUS), and the like can be mentioned, for example.

The flow path formation plate 620 is provided on (under in the example of FIG. 2) the nozzle plate 610. As the materials of the flow path formation plate 620, silicon and the like can be mentioned, for example. By dividing the space between the nozzle plate 610 and the diaphragm 1 with the flow path formation plate 620, a reservoir (liquid storage portion) 624, a supply port 626 that communicates with the reservoir 624, and the pressure chamber 622 that communicates with the supply port 626 are provided as illustrated in FIG. 2. In this example, the reservoir 624, the supply port 626, and the pressure chamber 622 will be distinctively described but are all flow paths for liquid or the like and such flow paths may be designed in any manner. The supply port 626 has a shape in which the flow path is partially narrowed in the example of the drawings but the supply port 626 can be arbitrarily formed according to the design and the narrowed portion is not necessarily indispensable. The reservoir 624, the supply port 626, and the pressure chamber 622 are divided by the nozzle plate 610, the flow path formation plate 620, and the diaphragm 1. The reservoir 624 can temporarily store ink supplied from the outside (e.g., ink cartridge) through a through hole 628 provided in the diaphragm 1. The ink in the reservoir 624 can be supplied to the pressure chamber 622 through the supply port 626. In the pressure chamber 622, the capacity changes with the transformation of the diaphragm 1. The pressure chamber 622 communicates with the nozzle openings 621, and liquid or the like is ejected from the nozzle openings 621 due to changes in the capacity of the pressure chamber 622.

The piezoelectric element 100 is provided on (under in the example of FIG. 2) the flow path formation plate 620. The piezoelectric element 100 is electrically connected to a piezoelectric element drive circuit (not illustrated) and can operate based on signals of the piezoelectric element drive circuit (vibration, transformation). The diaphragm (substrate 1) can be transformed due to the operation of the laminate structure (piezoelectric layer 20) and can change as appropriate the internal pressure of the pressure chamber 622.

The case 630 can store the nozzle plate 610, the flow path formation plate 620, and the piezoelectric element 100 as illustrated in FIG. 2. As the materials of the case 630, resin, metal, and the like can be mentioned, for example.

The liquid ejection head 600 contains the piezoelectric element 100 described above. Therefore, the liquid ejection head having improved reliability can be realized.

Here, the case where the liquid ejection head 600 is an ink jet recording head is described. However, the liquid ejection head of the invention is, for example, used as a color material ejection head for use in manufacturing a color filter of a liquid crystal display and the like, an electrode material ejection head for use in forming an electrode of an organic electroluminescence display, FED (field emission display), and the like, a biological organic material ejection head for use in manufacturing a biochip, etc.

3. Method for Manufacturing Piezoelectric Element and Liquid Ejection Head

Next, the method for manufacturing the piezoelectric element 100 according to this embodiment will be described. FIG. 3A to FIG. 5C are cross sectional views schematically illustrating the method for manufacturing the piezoelectric element 100 and the method for manufacturing the liquid ejection head of this embodiment. The following description is given taking the case where the piezoelectric element 100 contained in the liquid ejection head 600 is manufactured as an example. Therefore, the method for manufacturing a piezoelectric element according to this embodiment is not limited to the following description.

Figure 3A:
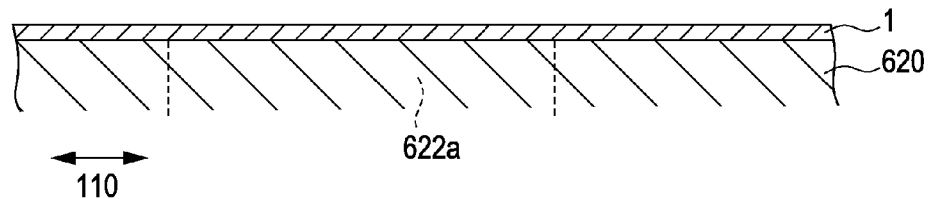
FIGS. 3A to 3D are cross sectional views schematically illustrating a manufacturing process of the piezoelectric element and the liquid ejection head of this embodiment.

First, the substrate 1 is prepared as illustrated in FIG. 3A. When the liquid ejection head 600 containing the piezoelectric element 100 is manufactured, a diaphragm formed on the flow path formation plate 620 is prepared as the substrate 1. In the flow path formation plate 620 prepared here, a flow path, such as the pressure chamber 622, may or may not be formed. In this embodiment, the flow path formation plate 620 has no flow paths, such as the pressure chamber 622, and one having a region 622a serving as the pressure chamber 622 is prepared. She details of the substrate 1 are described above and thus are omitted.

Figure 3B:
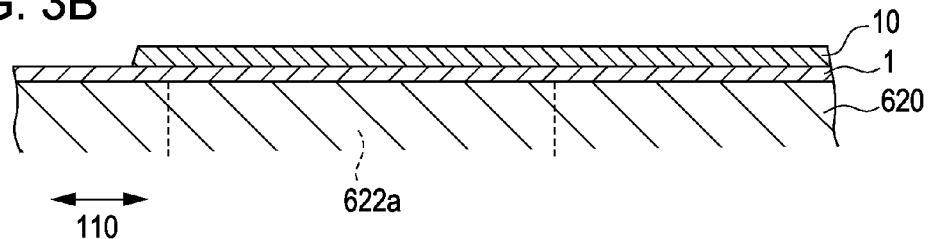

Next, as illustrated in FIG. 3B, the first conductive layer 10 (first electrode 10) is formed on the substrate 1 (diaphragm). A method for forming the first conductive layer 10 is not particularly limited and known film forming methods can be used. For example, a conductive film can be formed by vapor deposition methods, such as a CVD method and a PVD method, a plating method, a sputtering method, an MOD method, a spin coat method, and the like, and then the conductive film can be formed into the first conductive layer 10 having a desired shape by known patterning methods. The details of the first conductive layer 10 (first electrode 10) are described above and thus are omitted.

The above-described known film formation methods can be applied to the following known methods for forming a conductive layer. Known patterning methods used in the method for manufacturing the piezoelectric element in this embodiment can be carried out by known photolithographic techniques and/or etching techniques after the formation of a resist layer as appropriate according to desired shape. When using etching techniques, wet etching or dry etching can be used as appropriate.

Here, although not illustrated, an antioxidant film, such as a titanium nitride film or an alignment control film for controlling the alignment of piezoelectric layers, such as a titanium film or a lantern nickel oxide film, may be formed on the first conductive layer 10 or the substrate 1 (diaphragm). Moreover, an adhesion layer, such as titanium and chromium, may be included between the first conductive layer 10 and the substrate 1 (diaphragm).

Figure 3C:
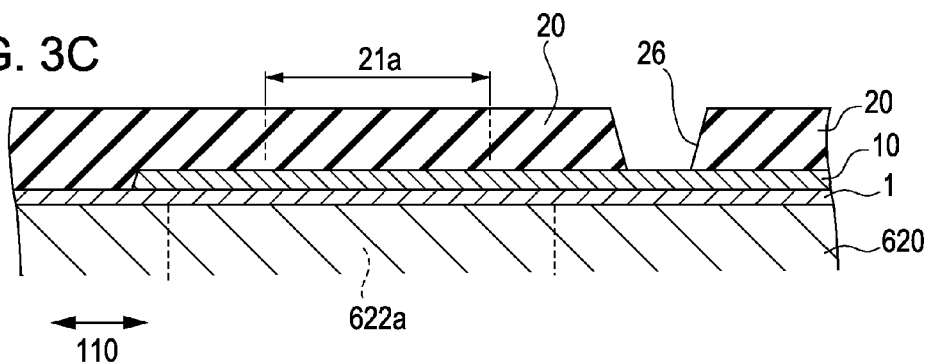

Next, as illustrated in FIG. 3C, the piezoelectric layer 20 having a region 21a serving as the active region 21 is formed on the first conductive layer 10. As illustrated in FIG. 3C, a portion of the piezoelectric layer 20 formed on the first conductive layer 10 above a region 622a in which the pressure chamber 622 is to be formed is the region 21a serving as the active region 21.

The method for forming the piezoelectric layer 20 is not particularly limited but known formation methods can be used. First, for example, a piezoelectric material film is formed by a sol gel process or the like. The piezoelectric material film may be formed by a spin coat method, a CVD method, an MOD method, a sputtering method, a laser ablation method, or the like. Next, the piezoelectric material film is heat treated for the purpose of crystallization of the piezoelectric material. Thus, a piezoelectric film containing the crystallized piezoelectric body can be formed. The heat treatment conditions are not particularly limited insofar as the temperature is a temperature at which the used piezoelectric material film can be crystallized. For example, the heat treatment may be performed in an oxygen environment at 500° C. or more and 800° C. or lower. The details of the piezoelectric layer 20 are described above and thus are omitted.

Next, the piezoelectric film can be patterned into a desired shape to thereby form the piezoelectric layer 20. Here, as illustrated in FIG. 3C, the process for patterning the piezoelectric layer 20 may include a process for forming the contact hole 26 that exposes a portion of the first conductive layer 10. Here, the contact hole 26 is formed at the position apart from the region in which the second conductive layer 30 described later is formed.

Figure 3D:
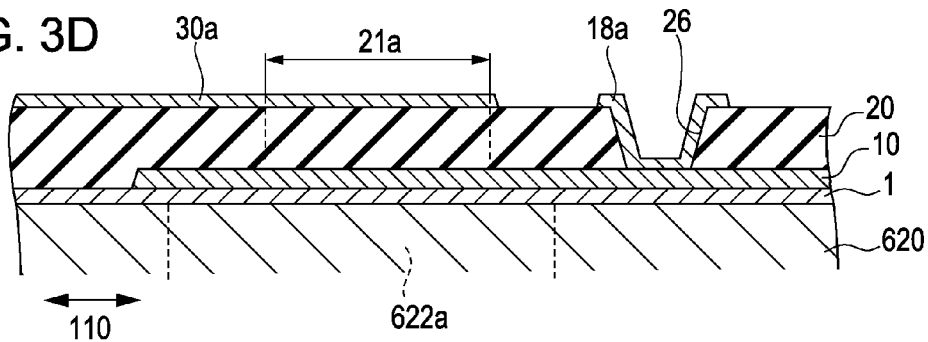

Next, as illustrated in FIG. 3D, a second conductive layer 30a that overlaps with the active region 21 serving as the region 21a is formed on the piezoelectric layer 20. Here, the materials of the second conductive layer 30a may include iridium as the main ingredients. The second conductive layer 30a is a conductive layer that is patterned to serve as the third conductive portion 35 described above. Therefore, as illustrated in FIG. 3D, the second conductive layer 30a is formed in such a manner as to overlap with at least the region 21a. The second conductive layer 30a is patterned in such a manner as to have a larger external form than a desired external form of the third conductive portion 35.

Here, as illustrated in FIG. 3D, the process for forming the second conductive layer 30a may include a process for forming a wiring layer 18a that is electrically connected to the first conductive layer 10 in the contact hole 26 and is apart from the second conductive layer 30a. The wiring layer 18a is a wiring layer that forms a portion of the lead wiring 18 and is provided in such a manner as to cover at least the first conductive layer 10 in the contact hole 26. According to the structure, the exposed surface of the first conductive layer 10 in the contact hole 26 can be protected from damages in the following processes, so that the electrical connection reliability of the first conductive layer 10 (first electrode 10) and the lead wiring 18 can be increased.

Figure 4A:
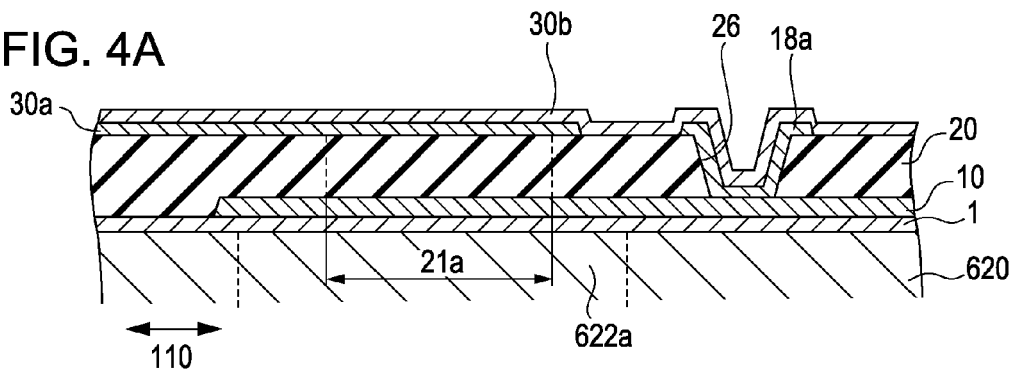
FIGS. 4A to 4D are cross sectional views schematically illustrating a manufacturing process of the piezoelectric element and the liquid ejection head of this embodiment.

Next, as illustrated in FIG. 4A, a third conductive layer 30b that overlaps with the region 21a is formed on the second conductive layer 30a. The third conductive layer 30b may continuously cover the second conductive layer 30a and the wiring layer 18a. Here, the materials of the third conductive layer 30b may be different from those of the second conductive layer 30a. For example, the third conductive layer 30b may contain gold as the main ingredients and may contain nickel-chromium alloy.

Figure 4B:
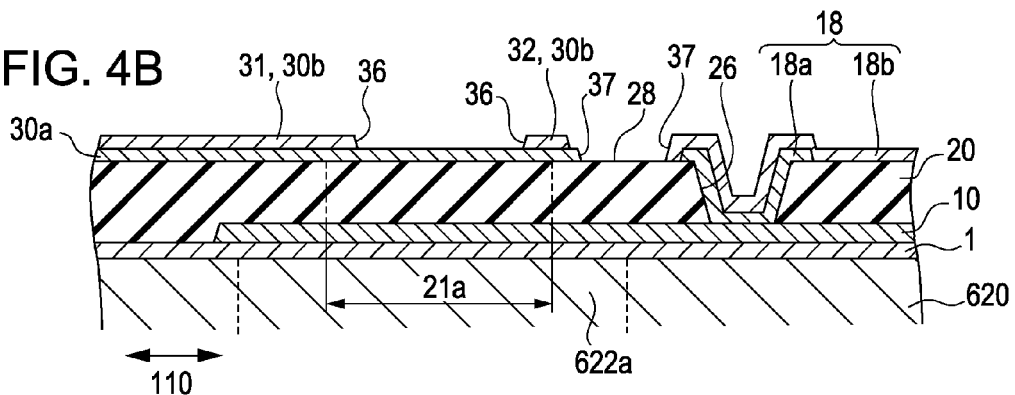

Next, as illustrated in FIG. 4B, the third conductive layer 30b is patterned to form an opening portion 36, which divides the third conductive layer 30b into the first portion 31 and the second portion 32, in the third conductive layer 30b above the region 21a. Thus, as illustrated in FIG. 4B, the first portion 31 of the third conductive layer 30b is formed above one end portion surface of the region 21a in the first direction 110 and the second portion 32 of the third conductive layer 30b is formed above the other end surface. As illustrated in FIG. 4B, the opening portion 36 is located inside in plan view relative to both the end portions surfaces of the region 21a in the first direction 110. The opening portion 36 may be able to divide the third conductive layer 30b into the first portion 31 and the second portion 32 at least in the third conductive layer 30b above the region 21a and the first portion 31 and the second portion 32 may be continuous in a region outside the region in which the piezoelectric element 100 is formed or may be completely divided by the opening portion 36.

As illustrated in FIG. 4B, when the third conductive layer 30b is patterned in order to form the opening portion 36, an opening portion 37 is formed that divides the third conductive layer 30b formed on the wiring layer 18a and the above-described first and second portions 31 and 32. Thus, a wiring layer 18b is formed on the wiring layer 18a and a lead wiring layer 18 (18a, 18b) can be formed that is electrically connected to the first conductive layer 10 in the contact hole 26 and is apart from the second conductive layer 30a. By forming the opening portion 37, a portion 28 in which the piezoelectric layer 20 is exposed can be provided between the second conductive layer 30a and the lead wiring layer 18 that are apart from each other as illustrated in FIG. 4B.

Figure 4C:
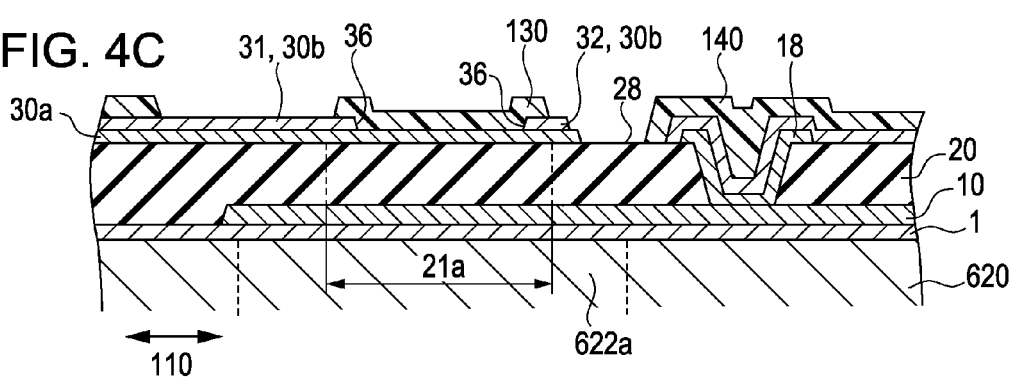

Next, as illustrated in FIG. 4C, a resist layer 130, which covers the opening portion 36 and the peripheral portion at the side of the opening portion 36 of the first portion 31 and the second portion 32, is formed on the third conductive layer 30b. Here, the peripheral portion of the first portion 31 and the second portion 32 refers to a portion at the side of the opening portion 36 and portions of the upper surface continuous to the side surfaces. The resist layer 130 is provided in such a manner as to reach the peripheral portion of the second portion 32 through the inside of the opening portion 36 from the peripheral portion of the first portion 31 in the first direction 110. As illustrated in FIG. 4C, the arrangement of the resist layer 130 in the first direction 110 may be determined as appropriate considering the retreat of materials in the horizontal direction of the second conductive layer 30a described later and the third conductive layer 30b (31, 32) due to the etching process.

When forming the resist layer 130, a resist layer 140 that covers the lead wiring layer 18 is formed as illustrated in FIG. 4C. In this case, as illustrated in FIG. 4C, the resist layer 140 is provided so that the portion 28 in which the piezoelectric layer 20 is exposed remains between the second conductive layer 30a and the lead wiring layer 18.

Figure 4D:
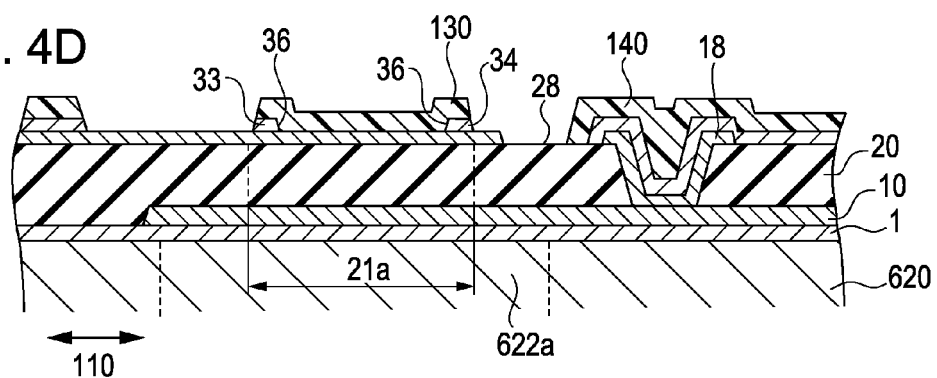

Next, as illustrated in FIG. 4D, the third conductive layer 30b (the first portion 31 and the second portion 32) is etched using the resist layer 130 to form the first conductive portion 33 and the second conductive portion 34. The etching process here is not particularly limited and, for example, known wet etching techniques may be applied. For an etchant, known active ingredients can be used as appropriate in terms of the selectivity of the materials of the third conductive layer 30b and other materials. When the materials of the third conductive layer 30b contain gold and nickel chrome alloy, etching active ingredients, such as potassium iodide to the gold and ceric ammonium nitrate to the nickel chrome alloy, can be used, for example.

Figure 5A:
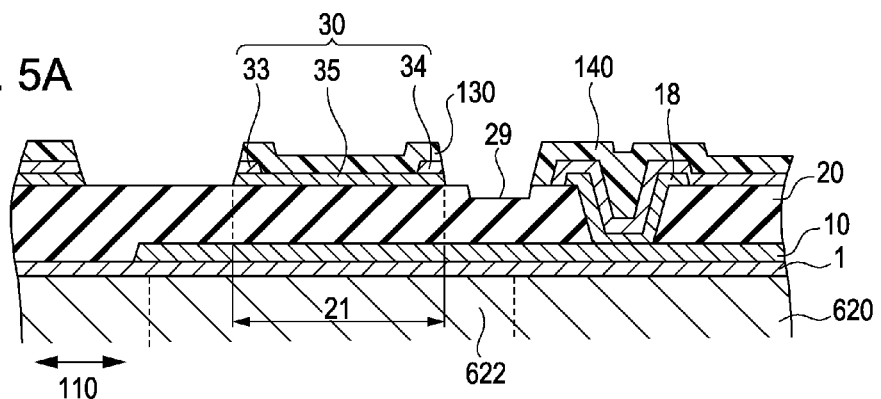
FIGS. 5A to 5C are cross sectional views schematically illustrating a manufacturing process of the piezoelectric element and the liquid ejection head of this embodiment.

Next, as illustrated in FIG. 5A, the second conductive layer 30a is etched using the resist layer 130 to form the third conductive portion 35. Thus, the second electrode 30 constituted by the first conductive portion 33, the second conductive portion 34, and the third conductive portion 35 can be formed. The details of the second electrode 30 are described above and thus are omitted.

To the etching process here, known dry etching techniques may be applied. Thus, when the second conductive layer 30a contains Ir, etching can be efficiently performed. As known dry etching techniques, dry etching may be performed using a high-density plasma device, such as ion milling or RIE (Reactive Ion Etching), for example. As etching gas for use in the dry etching, chlorine gas containing (BCl3) or the like in the case of RI can be used. The etching gas may contain fluorine gas containing C4F8, argon gas, or the like in addition to the chlorine gas.

As described above, the dry etching time in the entire manufacturing process can be kept at the minimum by adopting wet etching for etching of the third conductive layer 30b and adopting dry etching for etching of the second conductive layer 30a. In general, as compared with wet etching devices, dry etching devices require a vacuum chamber and the device use cost, such as electric power consumption, is high. By adopting wet etching in a portion of the manufacturing process of the second electrode 30 and keeping the process for dry etching at the minimum, the total manufacturing cost of the production line can be reduced. Moreover, by adopting dry etching for patterning of the second conductive layer 30a without adopting wet etching for the entire manufacturing process of the second electrode 30, Ir, Pt, or the like having no effective etchant in wet etching can be employed for the materials of the second conductive layer 30a and even when the second conductive layer 30a contains such materials, etching can be performed with high accuracy.

Moreover, as illustrated in FIG. 5A, the portion in which the piezoelectric layer 20 is exposed between the second electrode 30 and the lead wiring layer 18 is not covered with the resist layer 130 or the resist layer 140, and thus a concave portion 29 is formed by dry etching. Moreover, although not illustrated, a rough surface subjected rough surface processing by dry etching may be formed in the concave portion 29. Thus, the surface distance between the lead wiring 18 and the second electrode 30 (the third conductive portion 35) can be further increased, the insulation properties of the lead wiring 18 and the second electrode 30 can be increased to thereby increase the reliability of the piezoelectric element 100.

Figure 5B:
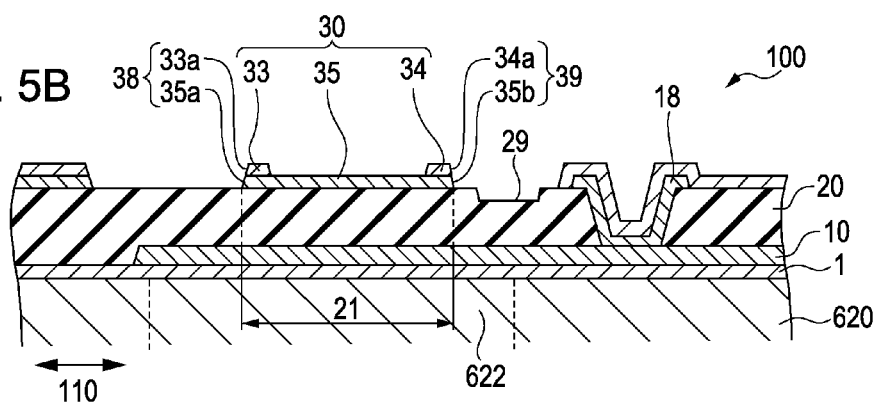

Next, as illustrated in FIG. 5B, the resist layers 130 and 140 are removed. Thus, the piezoelectric element 100 can be manufactured. Moreover, although not illustrated, the resist layers 130 and 140 may be partially removed and a portion may be used as a protective film.

Figure 5C:
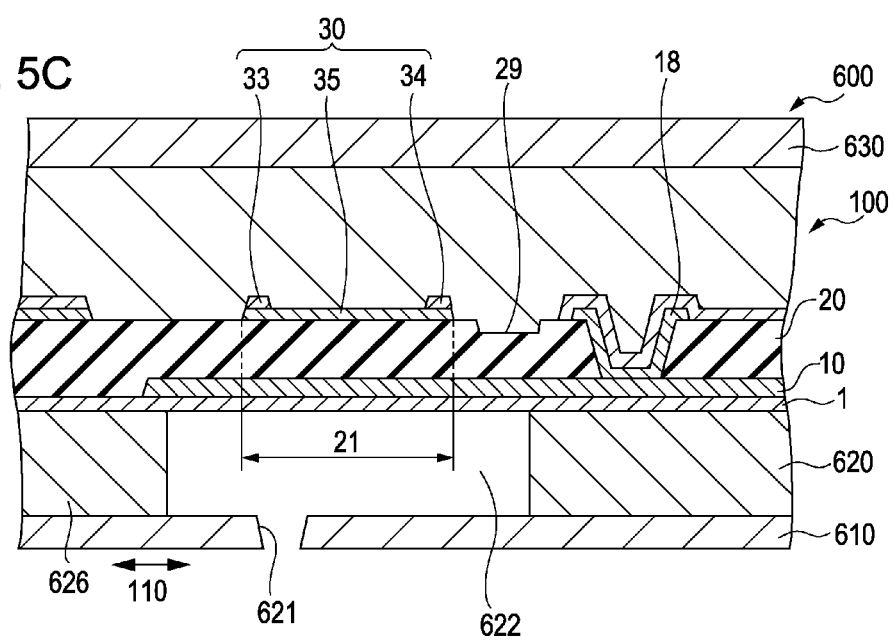

Next, when the liquid ejection head 600 containing the piezoelectric element 100 is manufactured, a flow path, such as the pressure chamber 622, is formed in the flow path formation plate 620 in the lower portion of the piezoelectric element 100, and the nozzle plate 610 is formed as illustrated in FIG. 5C. Moreover, as illustrated in FIG. 5C, the case 630 or the like is provided which contains a sealing plate in such a manner as to seal the piezoelectric element 100. Although not illustrated, the flow path formation plate 620 or the like may be processed after forming the sealing plate.

The method for manufacturing the piezoelectric element 100 according to this embodiment has the following characteristics, for example.

According to the method for manufacturing the piezoelectric element according to this embodiment, since the first portion 33, the second portion 34, and the second conductive layer 30a are etched using the same resist layer 130, the first conductive portion 33 and the second conductive portion 34 can be disposed with high accuracy on the end portions in the first direction 110 of the third conductive portion 35. Therefore, the piezoelectric element 100 having improved reliability can be highly accurately and simply manufactured.

Excessive displacement of the piezoelectric element and concentration of stress become higher at a portion closer to the end portions in the longitudinal direction. Therefore, the first conductive portion 33 and the second conductive portion 34 are preferably disposed at portions closer to the end portions of the third conductive portion 35. According to the method for manufacturing the piezoelectric element according to this embodiment, the second electrode 30 is formed using the resist layer 130 as described above, and thus the first conductive portion 33 and the second conductive portion 34 can be highly accurately and simply disposed at portions closer to the end portions of the third conductive portion 35.

Moreover, the materials of the first conductive portion 33 and the second conductive portion 34 may be different from those of the third conductive portion 35 directly provided on the piezoelectric layer 20. Therefore, when the first conductive portion 33 and the second conductive portion 34 are disposed on the upper surface of the piezoelectric layer 20 due to the alignment error in the manufacturing process, portions different in the voltage application rate are formed due to the differences in the conductivity of the materials in the periphery of the end portions of the piezoelectric layer 20, and thus the reliability of the physical output of the piezoelectric element 100 may be reduced. In contrast, according to the method for manufacturing the piezoelectric element according to this embodiment, there is no possibility that the first conductive portion 33 and the second conductive portion 34 are disposed on the upper surface of the piezoelectric layer 20, and thus a highly reliable piezoelectric element can be highly accurately and simply manufactured.

4. Liquid Ejection Device

Figure 6:
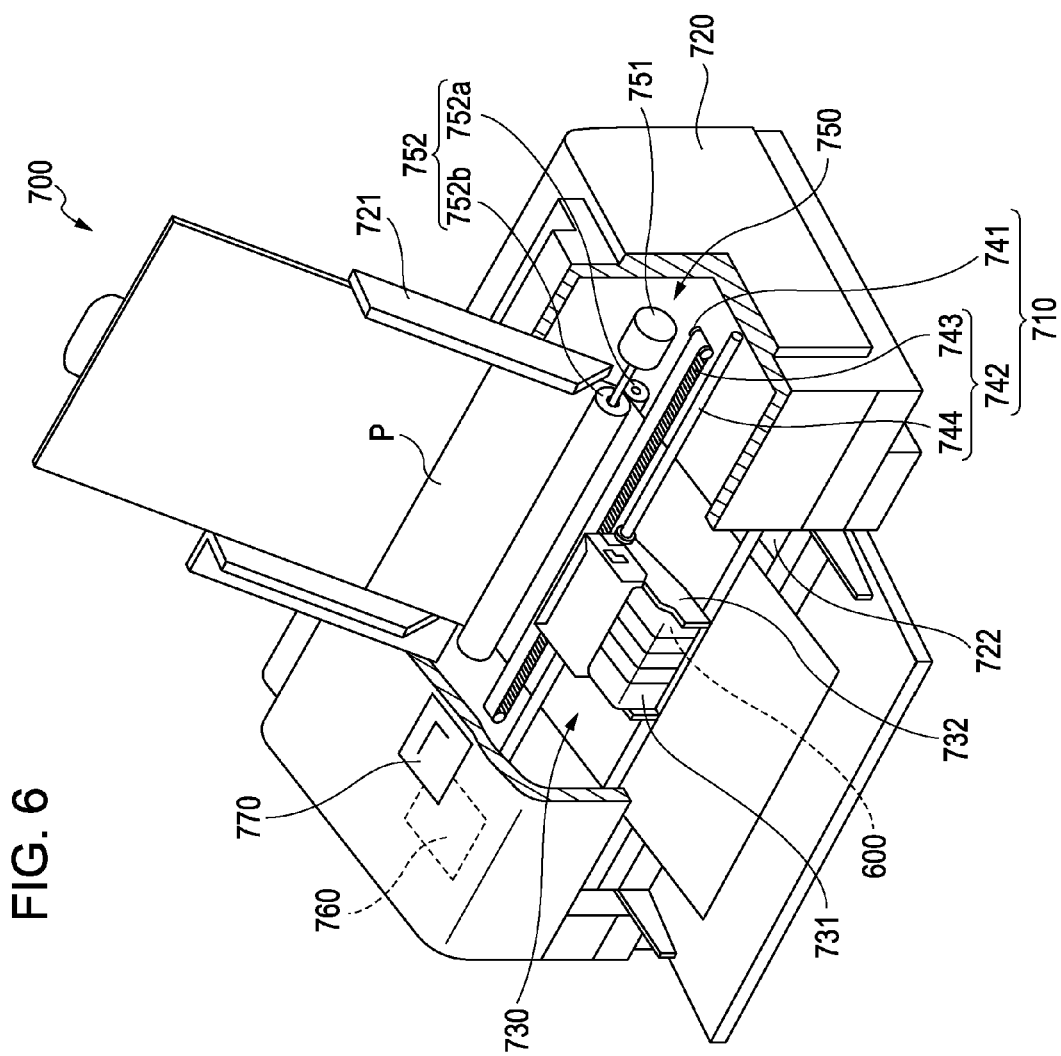
FIG. 6 is a perspective view schematically illustrating a liquid ejection head.

Next, the liquid ejection head according to this embodiment will be described with reference to the drawings. The liquid ejection device has the above-described liquid ejection head. The following description is given to the case where the liquid ejection head is an ink jet printer having the liquid ejection head 600. FIG. 6 is a perspective view schematically illustrating a liquid ejection device 700 according to this embodiment.

The liquid ejection device 700 contains a head unit 730, an actuator 710, and a control portion 760 as illustrated in FIG. 6. The liquid ejection device 700 can further contain a device body 720, a paper feed portion 750, a tray 721 on which a recording paper P is placed, an discharge port 722 that discharges the recording paper P, and an operation panel 770 disposed on the upper surface of the device body 720.

The head unit 730 has an ink jet recording head (hereinafter simply referred to as "head") constituted by the above-described liquid ejection head 600. The head unit 730 further has an ink cartridge 731 that supplies ink to the head and a transport portion (carriage) 732 on which the head and the ink cartridge 731 are mounted.

The actuator 710 can reciprocate the head unit 730. The actuator 710 has a carriage motor 741 serving as the drive source of the head unit 730 and a reciprocating mechanism 742 that reciprocates the head unit 730 in response to the rotation of the carriage motor 741.

The reciprocating mechanism 742 is provided with a carriage guide axis 744, both ends of which are supported by a frame (not illustrated) and a timing belt 743 that extends in parallel to the carriage guide axis 744. The carriage guide axis 744 supports the carriage 732 in such a manner that the carriage 732 can freely reciprocate. Furthermore, the carriage 732 is fixed to one portion of the timing belt 743. When the timing belt 743 is made to run by the operation of the carriage motor 741, the head unit 730 reciprocates while being guided by the carriage guide axis 744. During the reciprocation, ink is ejected as appropriate from the head, so that printing to the recording paper P is performed.

This embodiment describes the example in which printing is performed while both the liquid ejection head 600 and the recording paper P move. However, the liquid ejection head of the invention may have a mechanism in which the liquid ejection head 600 and the recording paper P mutually and relatively change the position, so that printing to the recording paper P is performed. This embodiment describes the example in which printing is performed to the recording paper P. However recording media to which printing can be performed by the liquid ejection head of the invention are not limited to paper and various media, such as cloth, film, and metal, can be mentioned and the structure can be changed as appropriate.

The control portion 760 can control the head unit 730, the actuator 710, and the paper feed portion 750.

The paper feed portion 750 can feed the recording paper P to the head unit 730 side from the tray 721. The paper feed portion 750 is provided with a feed motor 751 serving as the drive source and a feed roller 752 that rotates by the operation of the feed motor 751. The feed roller 752 is provided with a follower roller 752a and a driving roller 752b that vertically face each other with the transportation route of the recording paper P between the rollers. The driving roller 752b is connected to the feed motor 751. When the feed paper portion 750 is driven by the control portion 760, the recording paper P is transported in such a manner as to pass under the head unit 730. The head unit 730, the actuator 710, the control portion 760, and the paper feed portion 750 are provided in the device body 720.

The head unit 730, the actuator 710, the control portion 760, and the paper feed portion 750 are provided in the device body 720.

The liquid ejection device 700 contains the piezoelectric element 100 manufactured by the method for manufacturing the piezoelectric element according to this embodiment. Therefore, the liquid ejection head having improved reliability can be realized.

The liquid ejection head described above as an example has one liquid ejection head and can perform printing on a recording medium by the liquid ejection head. The liquid ejection head described may have two or more liquid ejection heads. When the liquid ejection device has two or more liquid ejection heads, the two or more liquid ejection heads may be independently operated as described above or the two or more liquid ejection heads may be connected to each other to be one assembled head. As such an assembled head, a line type head in which each nozzle opening of two or more heads has an interval as a whole can be mentioned, for example.

As described above, the ink jet recording device 700 is described as an ink jet printer as an example of the liquid ejection head according to the invention and the liquid ejection head according to the invention can also be industrially utilized. As the liquid (liquid material) or the like that is ejected in this case, various kinds of functional materials whose viscosity is adjusted to a suitable viscosity by a solvent or a dispersion medium can be used. The liquid ejection head of the invention can also be preferably used, in addition to image recorders, such as the printer described above, a color material ejection head for use in manufacturing a color filter of a liquid crystal display and the like, an electrode material ejection head for use in forming an electrode of an organic electroluminescence display, FED (field emission display), and the like, and a biological organic material ejection head for use in manufacturing a biochip.

The above-described embodiments and various modifications each are one example and the invention is not limited thereto. For example, two or more of the embodiments and the modifications can be combined as appropriate.

The invention is not limited to the embodiment described above and can be modified in various manners. For example, the invention includes the substantially same structure (e.g., structure with same functions, methods, and results or structure with the same objects and effects) as the structures described with the embodiments. The invention also includes a structure in which non-essential portions of the structures described in the embodiments are replaced. The invention also includes a structure that can demonstrate the same effects or a structure that can achieve the same objects as those in the structures described with the embodiments. The invention also includes a structure in which known techniques are added to the structures described in the embodiments.

What is claimed is:

1. A method for manufacturing a piezoelectric element, comprising:
    a process for forming a first conductive layer on a substrate;
    a process for forming a piezoelectric layer having a region serving as an active region on the first conductive layer;
    a process for forming a second conductive layer, which overlaps with the region, on the piezoelectric layer;
    a process for forming a third conductive layer, which overlaps with the region, on the second conductive layer;
    a process for forming an opening portion that divides the third conductive layer into a first portion and second portion in the third conductive layer above the region;
    a process for forming a resist layer that covers the opening portion and a peripheral portion at the side of the opening portion of the first portion and the second portion;
    a process for etching the third conductive layer using the resist layer to form a first conductive portion and a second conductive portion; and
    a process for etching the second conductive layer using the resist layer to form a third conductive portion.

2. The method for manufacturing a piezoelectric element according to claim 1, wherein
    the etching of the process for forming the first conductive portion and the second conductive portion is wet etching; and
    the etching of the process for forming the third conductive portion is dry etching.

3. A method for manufacturing a liquid ejection head, comprising the method for manufacturing a piezoelectric element according to claim 2.

4. The method for manufacturing a piezoelectric element according to claim 1, wherein the second conductive layer is comprised of one or more materials that are different from one or more materials that comprise the third conductive layer.

5. A method for manufacturing a liquid ejection head, comprising the method for manufacturing a piezoelectric element according to claim 4.

6. The method for manufacturing a piezoelectric element according to claim 1, wherein the second conductive layer includes iridium and the third conductive layer includes gold and nickel-chromium alloy.

7. A method for manufacturing a liquid ejection head, comprising the method for manufacturing a piezoelectric element according to claim 6.

8. The method for manufacturing a piezoelectric element according to claim 1, wherein
    the process for forming the piezoelectric layer includes a process for forming a contact hole that exposes a portion of the first conductive layer at the position apart from the second conductive layer;
    the process for forming the second conductive layer and the third conductive layer includes a process for forming a lead wiring layer that is electrically connected to the first conductive layer in the contact hole and is apart from the second conductive layer and the third conductive layer; and
    the process for forming the third conductive portion includes a process for forming a concave portion at a portion where the piezoelectric layer between the second conductive layer and the lead wiring layer that are apart from each other is exposed.

9. A method for manufacturing a liquid ejection head, comprising the method for manufacturing a piezoelectric element according to claim 8.

10. A method for manufacturing a liquid ejection head, comprising the method for manufacturing a piezoelectric element according to claim 1.

* * * * *